US012787749B2

(12) United States Patent
Hsu

(10) Patent No.: US 12,787,749 B2
(45) Date of Patent: Nov. 3, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventor: Hung-Jen Hsu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 804 days.

(21) Appl. No.: 18/313,720

(22) Filed: May 8, 2023

(65) Prior Publication Data

US 2024/0379543 A1 Nov. 14, 2024

(51) Int. Cl.

| | |
|---|---|
| ***G06F 30/3953*** | (2020.01) |
| ***G06F 30/3947*** | (2020.01) |
| ***H10W 20/43*** | (2026.01) |
| ***H10W 72/90*** | (2026.01) |
| *H10W 70/65* | (2026.01) |

(52) U.S. Cl.

CPC ........ *H10W 20/43* (2026.01); *G06F 30/3953* (2020.01); *H10W 72/90* (2026.01); *G06F 30/3947* (2020.01); *H10W 70/65* (2026.01)

(58) Field of Classification Search

CPC ............ G06F 30/3953; G06F 30/3947; H10W 20/43; H10W 72/90; H10W 70/65

USPC ............................ 716/126, 129, 130; 703/14

See application file for complete search history.

(56) References Cited

U.S. PATENT DOCUMENTS

| | | | | | |
|---|---|---|---|---|---|
| 5,847,968 | A * | 12/1998 | Miura | G06F 30/39 | 716/135 |
| 8,188,607 | B2 * | 5/2012 | Lin | H10W 70/65 | 349/149 |
| 8,726,222 | B1 * | 5/2014 | Lawson | G06F 30/394 | 716/135 |
| 11,900,041 | B2 * | 2/2024 | Thazhathidathil | G06F 30/398 | |
| 2007/0139068 | A1 * | 6/2007 | Behzad | H10W 72/20 | 257/E23.021 |
| 2015/0347659 | A1 * | 12/2015 | Chiang | G06F 30/392 | 716/55 |

(Continued)

FOREIGN PATENT DOCUMENTS

| | | | | |
|---|---|---|---|---|
| CN | 113225898 A | | 8/2021 | |
| DE | 102016011478 A1 | * | 3/2017 | H10W 20/091 |

(Continued)

OTHER PUBLICATIONS

Lewis, "Algorithms for Finding Shortest Paths in Networks with Vertex Transfer Penalties", Algorithms, 2020, vol. 13, No. 269, 21 pages. (Year: 2020).*

(Continued)

*Primary Examiner* — Phallaka Kik

(74) *Attorney, Agent, or Firm* — Foley & Lardner LLP

(57) ABSTRACT

A semiconductor device is manufactured by a process including identifying a course extending between a minimum distance between a first perimeter of a first conductive pad and a second perimeter of a second conductive pad. The process can include forming a first conductive trace crossing the identified course. The first conductive trace can extend along a direction perpendicular to the course.

20 Claims, 13 Drawing Sheets

800

(56) References Cited

U.S. PATENT DOCUMENTS

| | | | | |
|---|---|---|---|---|
| 2016/0099204 | A1* | 4/2016 | Lin | H05K 1/111 438/126 |
| 2017/0263583 | A1* | 9/2017 | Lin | H10W 70/05 |
| 2019/0041681 | A1* | 2/2019 | Lai | G02F 1/133528 |
| 2021/0109999 | A1* | 4/2021 | Thazhathidathil | G06F 30/394 |
| 2022/0414414 | A1* | 12/2022 | Kondo | G06F 3/0679 |
| 2023/0016420 | A1 | 1/2023 | Hutter et al. | |
| 2023/0292447 | A1* | 9/2023 | Eckert | H05K 1/0245 |
| 2024/0403538 | A1* | 12/2024 | Kobayashi | G06F 30/367 |

FOREIGN PATENT DOCUMENTS

| | | | | | |
|---|---|---|---|---|---|
| KR | 20220104731 | A | * | 7/2022 | H10D 84/903 |
| TW | I550768 | B | * | 9/2016 | H10P 74/207 |
| TW | 202123056 | A | | 6/2021 | |
| TW | 202247387 | A | | 12/2022 | |

OTHER PUBLICATIONS

Long et al., "An O(nlogn) Edge-Based Algorithm for Obstacle-Avoiding Rectilinear Steiner Tree Construction", ACM, Apr. 13-16, 2008, 8 pages. (Year: 2008).*

Liu et al., Wipo Machine English Translation of Chinese Patent Document No. CN-113225898-A, published Aug. 6, 2021, machine translated on Jun. 13, 2026. (Year: 2026).*

* cited by examiner

SEMICONDUCTOR DEVICES AND METHODS OF MANUFACTURING THEREOF

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-nanometer node), which allows more components to be integrated into a given area. As the demand for miniaturization, higher speed, and greater bandwidth, as well as lower power consumption and latency has grown recently, there has grown a need for smaller and more creative packaging techniques for semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
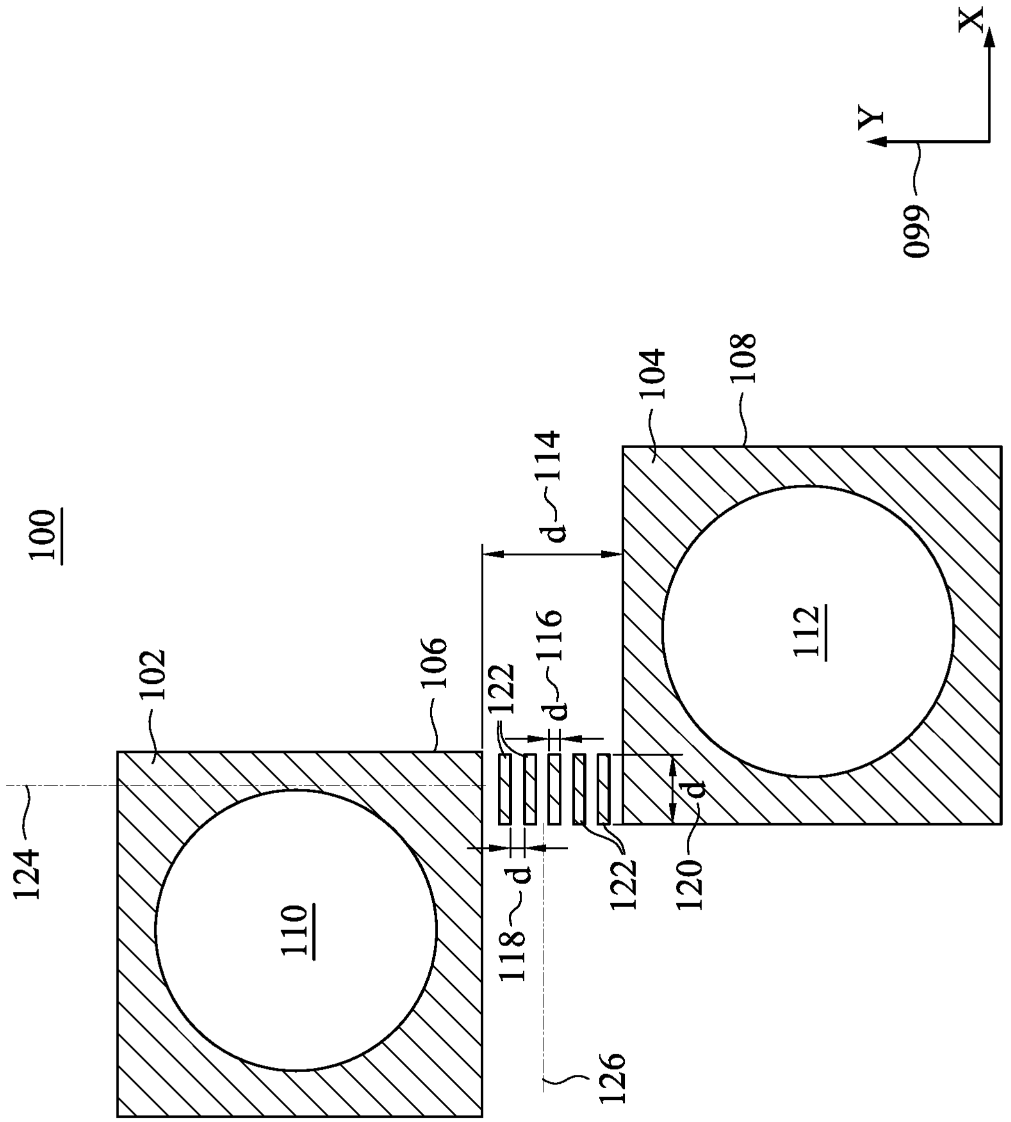
FIG. 1 illustrates a schematic diagram of an example redistribution structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices can include inter-layer vias to form connections between layers. The vias include or interface with conductive pads, and may include or be surrounded by keep out areas. Interlayer connections can include dense connections, such that routing a netlist of the semiconductor device can be challenging. Other conductive pads may also be present on various layers of a semiconductor device which may further constrain routing. Various signals such as power signals, data signals, clock signals, or the like can be associated with various signal integrity parameters which may correspond to a geometry of a conductive element. For example, a resistivity of a power signal or a characteristic impedance of a data line can correspond to a track thickness or a spacing between a differential pair, distance to a ground plane, etc. Some conductive pads or other features of a layer of a semiconductor device (e.g., a redistribution layer) can include a course therebetween, such that a conductive trace can pass over the course. However, the perimeter of the conductive pad may not correspond to a center of the conductive pad, thus routing a conductive trace between a center point of the device can reduce a distance of the course relative to a course between a perimeter of the conductive pads. Systems and methods disclosed herein can determine a course between an outer perimeter at least two conductive pads, or a keep out associated therewith, such that a number of nets or a thickness of conductive traces routed between the conductive pads may be increased relative to alternative systems and methods.

FIG. 1 illustrates a cross-sectional view of an example redistribution structure 100, in accordance with various embodiments. The cross sectional view can be along a lateral plane along a z axis of a semiconductor device, the lateral plane being described with reference to a plane axis 099 having an X direction and Y direction. It should be appreciated that the redistribution structure 100 of FIG. 1 is simplified for illustration purposes. Accordingly, the lateral plane can include any of various other components or features, while remaining within the scope of the present disclosure.

As shown, the redistribution structure 100 includes a first conductive pad 102 laterally bounded (e.g., defined) by a first perimeter 106, and a second conductive pad 104 laterally bounded (e.g., defined) by a second perimeter 108. The conductive pads 102, 104 can be or include a via 110, 112 between adjacent or non-adjacent lateral planes of the semiconductor device (e.g., a through-interlayer-via (TIV), terminal connector, or other element). For example, the conductive pads 102, 104 may be configured to electrically connect to a first inter-layer via 110 and second inter-layer via 112, respectively. A plurality of conductive traces 122 are disposed between the first conductive pad 102 and the second conductive pad 104 according to an orientation described henceforth.

An electronic design automation (EDA) tool can determine a course between the conductive pads 102, 104. The course 124 traverses a minimum distance 114 between the first conductive pad 102 and the second conductive pad 104. More particularly, the minimum distance 114 extends between the respective first perimeter 106 and the second perimeter 108. As depicted, such a minimum distance 114 is less than a distance between the respective perimeters defined by a course between the center points of the conductive pads 102, 104. More generally, a minimum distance between perimeters of conductive pads 102, 104 can vary from a minimum distance for a center point for various conductive pads which are non-circular. The minimum distance 114 separates the first conductive pad 102 and the second conductive pad 104 for a parallel distance 120 separating the first conductive pad 102 and the second conductive pad 104. As depicted, the parallel distance 120 is an overlap distance along an X axis 099. In various embodiments, the parallel distance 120 may include a Y axis 099 component or include more than one minimum distance or a variation in distance less than a threshold as is further described with regard to, for example, FIG. 6.

The EDA tool can compare the minimum distance 114 to a maximum distance, such as a distance which may not be a routing constraint. For example, the EDA tool can compare spacing between conductive pads 102, 104 to a threshold such that for minimum distances 114 which are less than a threshold, the conductive traces 122 therebetween are defined, and for minimum distances 114 which are greater than the threshold, the conductive traces 122 therebetween are not defined. Such a threshold can avoid forming excessive conductive traces between distant conductive pads which may make routing difficult, or consume compute resources, such as memory and processor cycles and increase power usage. Such a threshold may be between about 10 μm to about 100 μm for some processes. One skilled in the art will understand that the threshold may vary for a process according to a number of connections, a density of connections, and so forth.

A further dimensional line 126 is shown along a direction perpendicular to the course 124. The EDA tool can cause conductive traces 122 to extend along the further dimensional line 126, crossing the course perpendicularly. The depicted conductive traces 122 extend along the parallel distance 120. In various embodiments, the conductive traces 122 can extend longer or shorter than the parallel distance 120. For example, the conductive traces 122 can extend a predefined distance such as a distance which is equal to a thickness 116, which may correspond to a minimum dimension of a process. In various embodiments, the conductive traces 122 can extend a minimum distance greater than the parallel distance 120, such as a distance offset from the parallel distance (e.g., 2 μm, 5 μm, or the like). In various embodiments, the conductive traces 122 can extend to snap to a predefined grid describing the layer of the semiconductor device (e.g., the redistribution layer). The EDA tool can cause the conductive tool to extend to the various lengths described herein according to a process, setting, user selection or the like.

In various embodiments, the conductive traces 122 may be of a regular thickness 116 and spacing 118 such as according to a process dimension associated with the semiconductor device. For example, wherein the course extends 26 μm between the first conductive pad 102 and the second conductive pad 104, and each conductive trace has a 2 μm minimum trace thickness and 2.5 μm spacing, the five depicted conductive traces 122 may be defined (e.g., N(2.5 μm+2 μm)+2.5 μm resolves to an integer maximum N of 5).

The various elements of the redistribution structure 100 may refer to physically assembled device such as copper or tungsten conductive elements overlaying a dielectric layer of a semiconductor device, or representation thereof generated by an electronic design automation (EDA) tool. For example, the EDA tool may define the dimensions for the features described herein, and manufacturing systems and devices may thereafter manufacture a device based on a design generated by the EDA tool. A sample flow is provided hereinafter at FIGS. 9, 10, and 11. The connections described herein may include connections formed by a same process (e.g., metal deposition or etching process whereupon a dielectric is formed there over such that the remaining metal portions are embedded in a dielectric material). For example, the conductive pads, the conductive traces, and further conductive elements connecting signals can be formed according to a simultaneous process wherein the various metallic portions of a redistribution layer are formed. Such a process nonetheless forms each of the disclosed portions, and connections therebetween. Indeed, the various processes disclosed herein can be performed in various ordered sequences, including temporally overlapping sequences (simultaneously).

Figure 2:
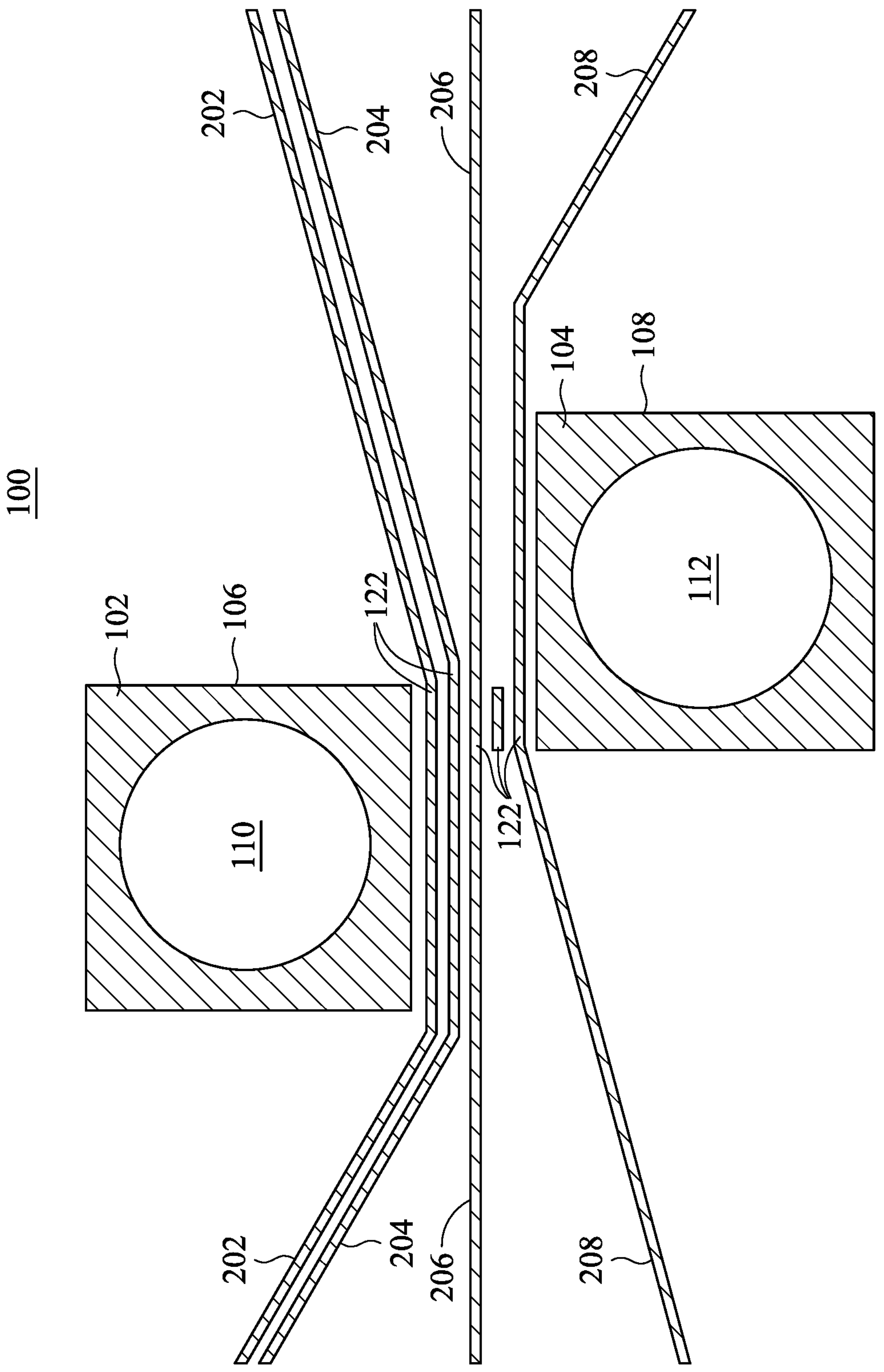
FIG. 2 illustrates another schematic diagram of an example redistribution structure, in accordance with some embodiments.

FIG. 2 illustrates a cross-sectional view of an example redistribution structure 100, connected to various nets of a netlist in accordance with various embodiments. For example, the figure can depict the same redistribution structure 100 of FIG. 1 following connection of the conductive traces 122 to various nets of a netlist. The netlist can include logical connections of a circuit for the semiconductor device. For example, the netlist can include connections between at least one semiconductor die or landing pads therefor. The netlist can include various signal types which can be associated with various geometries. For example, a clock signal can be associated with a routing requirement of a minimum distance from a high speed data signal, a power signal can be associated with a routing requirement for a resistivity corresponding to a length and thickness 116 of a number of conductive elements, or so forth.

The conductive traces 122 can connect to various conductive elements corresponding to a netlist of a design. For example, a netlist can include a differential pair comprising a first conductive element 202 and a second conductive element 204 having a pre-defined spatial relationship therebetween. The conductive elements can include one or more clock signals 206, data signals 208, or other nets of the netlist. The various signals can connect opposite ends of the conductive traces to join various portions of the semiconductor device. For example, the various signals can connect to or between semiconductor dies, terminals, integrated passive devices, and so forth. The connections may connect to vias landing pads, or the like to form connections between levels of a redistribution layer or other levels of a semiconductor device.

Some conductive traces 122 may not be connected to a net of a netlist. For example, the depicted spacing between the conductive pads 102, 104 includes 5 conductive traces 122, but a router of an EDA may assign less than 5 (e.g., 4, as depicted) nets of the netlist to pass between the first conductive pad 102 and the second conductive pad 104. An unassigned conductive trace 122 may be pruned (e.g., removed or otherwise indicated in a design file of the EDA) which may leave a spacing 118 in excess of a minimum spacing. In some embodiments, another conductive trace 122 can be adjusted based on the increased spacing. For example, a signal which is or is susceptible to a noisy signal can be placed, or a dimension of a signal (e.g., a power signal) can be increased to reduce resistive losses to occupy at least a portion of the spacing vacated by the pruned conductive trace 122.

Figure 3A:
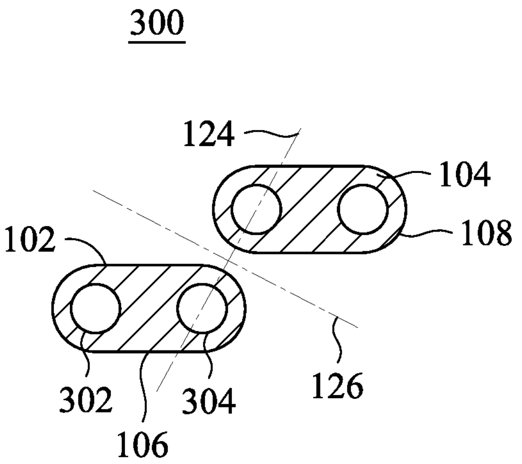
FIGS. 3A, 3B, and 3C illustrate a schematic diagram of an example pair of conductive pads undergoing an operation to route conductive traces therebetween, in accordance with some embodiments.

FIG. 3A illustrates a schematic diagram 300 of an example pair of conductive pads undergoing an operation to route conductive traces therebetween, in accordance with some embodiments. The conductive pads 102, 104 and the various depicted features may be logically formed (e.g., instantiated) by an EDA tool, and thereafter mechanically formed by a back end fabrication facility. Each conductive pad 102, 104 is configured to receive a first via 302 and a second via 304. For example, the first via 302 can extend upwards through the semiconductor device to another layer, and the second via 304 can extend downwards through the semiconductor device to another layer. A course 124 can extend within the depicted layer along an axis defined between the first perimeter 106 of the first conductive pad 102 and the second perimeter 108 of the second conductive pad 104, based on the positions of the conductive pads. In the depicted embodiment, the course 124 extends from a convex portion of the first perimeter 106 to a convex portion of the second perimeter 108, such that the course is extends along a single point. Put differently, the parallel distance 120 is zero.

A further dimensional line 126 can extend perpendicular to the course 124. For example, the further dimensional line 126 can intermediate the first conductive pad 102 and the second conductive pad 104. In some embodiments, the further dimensional line 126 can align to a midpoint of the minimum distance 114 between the first conductive pad 102 and the second conductive pad 104. In some embodiments, first and second further dimensional lines 126 can intersect the course 124 at the perimeter of the each of the conductive pads 102, 104, defining a rectangular area for a formation of the conductive traces 122.

Figure 3B:
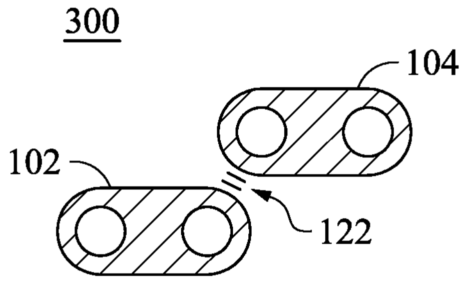

Referring now to FIG. 3B, conductive traces 122 are depicted parallel to the further dimensional line 126 (e.g., perpendicular to the course 124). In the depicted embodiment, the conductive traces extend along the direction of the further dimensional line 126. In some embodiments, the conductive traces 122 may be defined at a point along the course 124, wherein a direction of the conductive trace is defined at the point. In some embodiments, the conductive traces 122 can extend a predefined distance, or a predefined distance beyond the course 124. As described with respect to FIG. 2, the number of dimensional lines can correspond to a distance of the course between the respective conductive pads 102, 104.

Figure 3C:
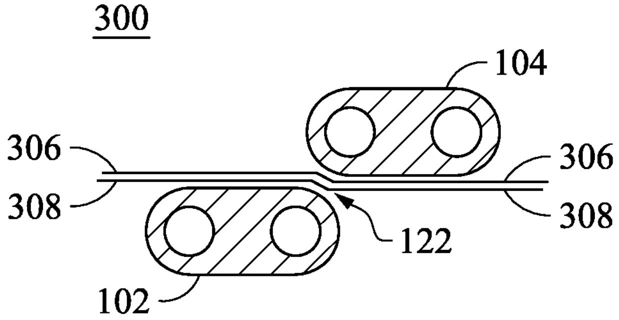

Referring now to FIG. 3C, a first conductive element 306 connects to at least one conductive trace 122 formed between the first conductive pad 102 and the second conductive pad 104 along opposite ends, such that the combination of the conductive trace 122 and the first conductive element 306 can convey signals between various portions of the semiconductor device. Likewise, a second conductive element 308 connects to at least another conductive trace 122 parallel to the aforementioned conductive trace 122. In various embodiments, additional or fewer conductive pads may be present. For example, an EDA can route a conductive trace 122 between a conductive pad and another keep out area such as a lateral edge of a semiconductor device. Although not depicted, the conductive elements 306, 308 connecting to the conductive traces 122 can connect to inter-layer connections such as vias, pads, or terminals.

Figure 4A:
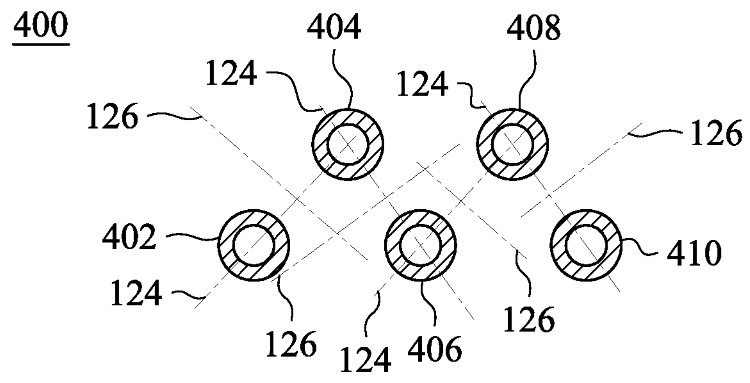
FIGS. 4A, 4B, and 4C illustrate another schematic diagram of an example pair of conductive pads undergoing an operation to route conductive traces therebetween, in accordance with some embodiments.
Figure 4B:
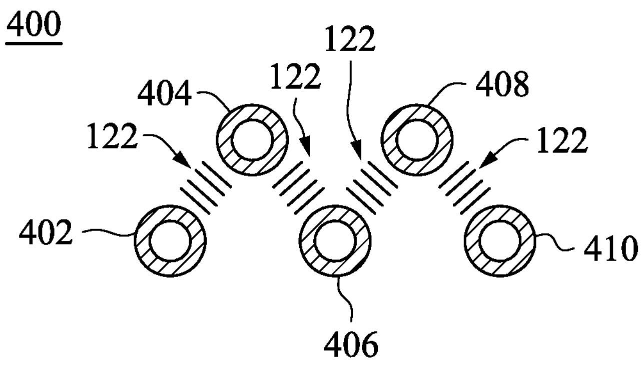
Figure 4C:
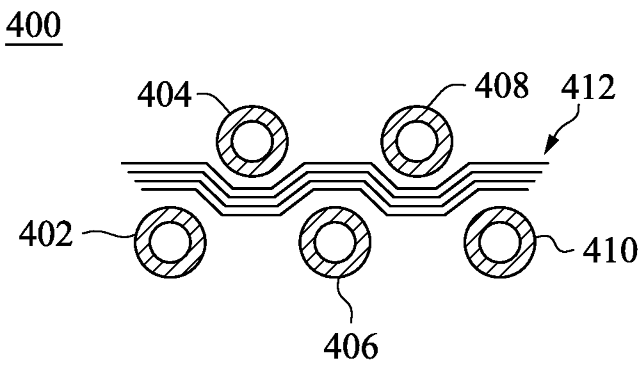

FIGS. 4A, 4B, and 4C illustrate another schematic diagram 400 of an example pair of conductive pads undergoing an operation to route conductive traces therebetween, in accordance with some embodiments. Referring now to FIG. 4A, a plurality of conductive pads are depicted. Particularly, a first conductive pad 402, second conductive pad 404, third conductive pad 406, fourth conductive pad 408, and fifth conductive pad 410 are provided. The EDA tool can generate the conductive pads (e.g., determine a location and geometry therefor), or receive an indication of their location and geometry. The EDA tool can generate a course between the various conductive pads 402, 404, 406, 408, 410. The EDA tool can compare the distances between the various conductive pads 402, 404, 406, 408, 410 to a threshold. For example, the EDA tool can compare a distance between the first conductive pad 402 (e.g., a center or perimeter thereof) and the third conductive pad 406 (e.g., a center or perimeter thereof) to a threshold, determine that the distance exceeds the threshold, and thus may omit a generation of conductive traces 122 therebetween. The EDA tool can compare a distance between the perimeter of the first conductive pad 402 and the perimeter of the second conductive pad 404, determine that the distance is less than a threshold, and continue to determine a course 124 therebetween.

The EDA tool can continue to generate comparisons between the various conductive pads 402, 404, 406, 408, 410. For example, as depicted, the EDA tool can determine a course 124 between the first 402 and second conductive pads 404; second 404 and third 406 conductive pads; third 406 and fourth conductive pads 408, and fourth 408 and fifth conductive pads 410. The EDA tool can thereafter determine further dimensional lines 126 corresponding to each of the courses 124. In some embodiments, a routing engine of the EDA tool can generate a course 124 based on an adjacent course 124, such as to minimize a change in angle therebetween. For example, if the distance between the second conductive pad 404 and fourth conductive pad 408 is less than the threshold, the EDA tool may omit a course 124 therebetween, based on a proximity to other conductive elements 122, courses 124, or the like.

Referring now to FIG. 4B, the plurality of conductive pads are shown with conductive traces 122 formed perpendicular to the courses 124 therebetween. Continuing with FIG. 4C, various signals 412 are connected to the conductive traces 122 to electrically couple various elements (dies, landings, terminals, or the like) of the semiconductor device. Referring now to FIG. 4C, various conductive elements 412 are connected to the conductive traces 122 to electrically couple various elements (dies, landings, terminals, or the like) of the semiconductor device. For example, the depicted conductive elements 412 can connect to further conductive pads, which may also include connective traces 122 formed therebetween connected to various conductive elements to convey signals, corresponding to nets of a netlist. Thus, an EDA tool can map a layer of a semiconductor device to a netlist.

Figure 5A:
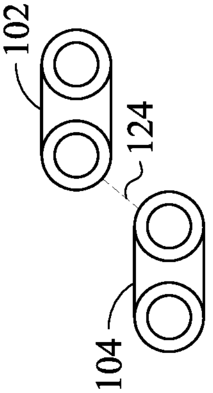
FIGS. 5A, 5B, 5C, 5D, 5E, 5F, 5G, 5H, 5I, and 5J illustrate top views of various conductive pad pairs and respective courses therebetween, in accordance with some embodiments.
Figure 5B:
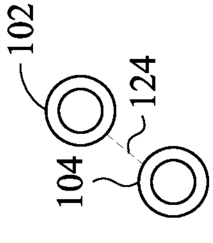
Figure 5C:
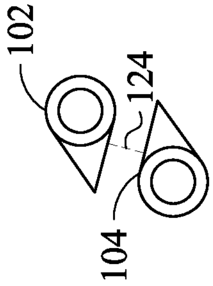
Figure 5D:
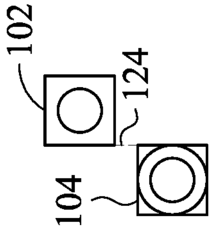
Figure 5E:
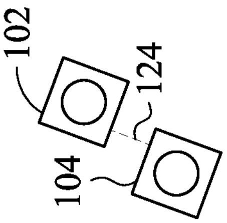

FIGS. 5A, 5B, 5C, 5D, 5E, 5F, 5G, 5H, 5I, and 5J illustrate top views of one of conductive pad pairs and respective courses 124 therebetween, in accordance with some embodiments. Referring now to FIG. 5A, a first conductive pad 102 and second conductive pad are shown offset as in FIG. 3A. A course 124 joins respective points of the convex curvatures of the respective perimeters of the conductive pads 102, 104 (at a minimum distance 114 between the conductive pads 102, 104). According to a relative position of the conductive pads 102, 104, the course 124 may extend along a linear portion of the conductive pads 102, 104, such that a parallel distance 120 may be greater than zero. Referring now to FIG. 5B, the conductive pads 102, 104 are circular, such that a course 124 defined between the center point may overlap with another course 124 defined by the perimeter. The EDA tool may nonetheless determine the course 124 based on the perimeter, rather than the center of the conductive pads 102, 104. Referring now to FIG. 5C, the conductive pads 102, 104 include a lateral and curved portion. The course 124 extends (e.g., as defined by an EDA tool) along a center of a parallel distance 120. Referring now to FIG. 5D, the conductive pads 102, 104 include a narrow or point parallel distance 120. Conductive traces 122 can be defined (e.g., by the EDA tool) perpendicular to the course 124 such that the signals connecting to the conductive traces 122 can diverge in different directions. For example, signals extending leftward may extend straight or upward, wherein signals extending rightward may extend straight or downward (as depicted). Referring now to FIG. 5E, the conductive pads 102, 104 shown in FIG. 5D are shown having a greater offset such that parallel distance 120 extends from the course in both directions. For example, the course 124 may be centered in the parallel distance 120.

Figure 5F:
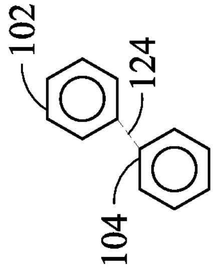
Figure 5G:
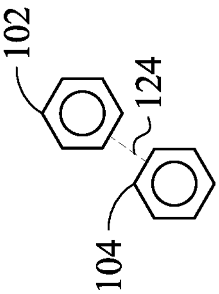
Figure 5H:
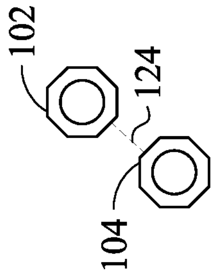

Referring now to FIG. 5F, the conductive pads 102, 104 include polygonal shapes having vertices intermediated by straight portions. In FIG. 5F, the minimum distance 114 between the conductive pads 102, 104 is between respective vertices such that the course 124 connects the vertices. FIG. 5G depicts the same hexagonal conductive pads 102, 104 as FIG. 5F with a first parallel distance 120 including a course 124. FIG. 5H depicts the same hexagonal conductive pads 102, 104 as FIGS. 5F and 5G with a second parallel distance 120, smaller than the first parallel distance 120, which includes a course 124.

Figure 5I:
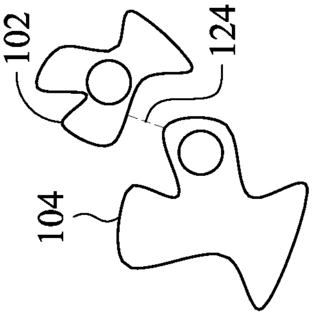
Figure 5J:
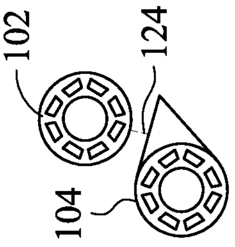

Referring now to FIG. 5I, an irregular first 102 and second conductive pads 104 is shown as connected by a course 124. The irregular first 102 and second conductive pads 104 are shown in greater detail in FIG. 6, henceforth. Referring now to FIG. 5J, a different first 102 and second conductive pad 104 are shown with a course 124 therebetween. Likewise, the various conductive pads depicted herein are not intended to be limiting, and the systems and methods described herein can be practices with various conductive pads, trenches, edges, or other keep out areas according to the various geometries thereof.

Figure 6:
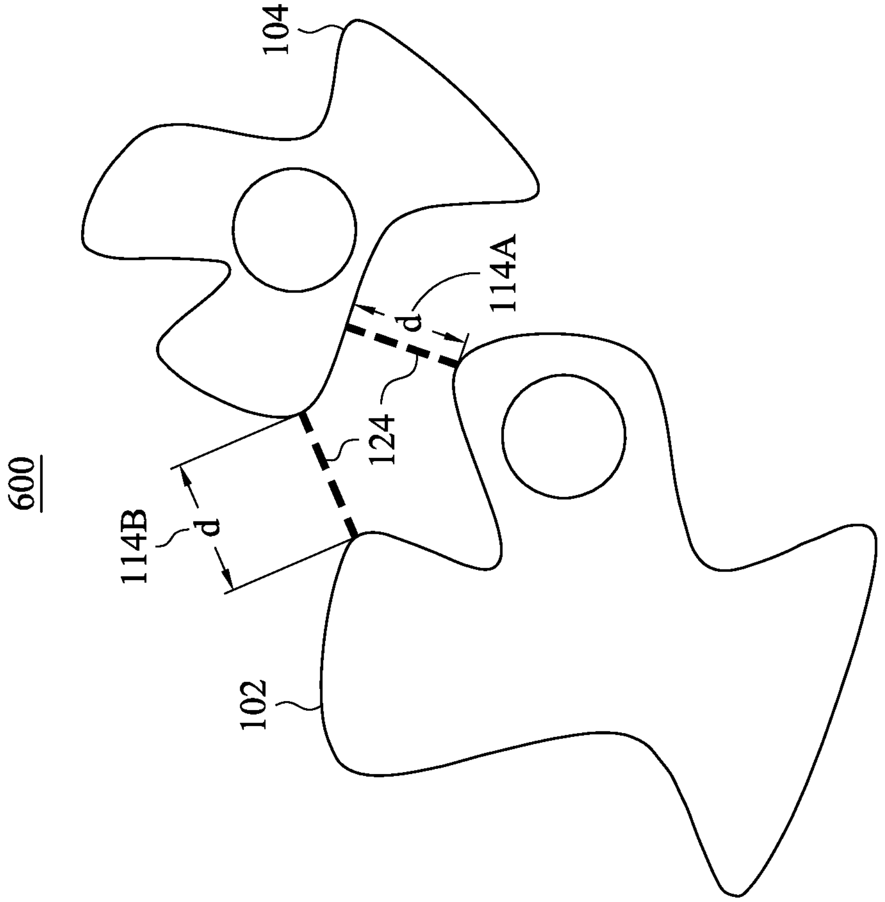
FIG. 6 is a detail view of a conductive pad pair with multiple courses therebetween, in accordance with some embodiments.

FIG. 6 is a detail view 600 of a conductive pad pair 102, 104, with multiple courses 124 therebetween, in accordance with some embodiments. The conductive pads 102, 104 are irregularly shaped such that a plurality of courses 124 are formed therebetween. For example, the conductive pads 102, 104 may have a same minimum distance 114 at each of the respective courses 124. In some embodiments, the courses 124 can be formed along different distances. For example, a first minimum distance 114A can be somewhat less than a second minimum distance 114B. The EDA tool can compare a difference between various minimum distances to a difference threshold, such that multiple courses 124 can be formed between the various minimum distances 114A, 114B, which can aid in routing. For example, the threshold can be less than about 1 μm. In some embodiments, the conductive traces 122 can further include connections between the portions formed along each course.

Figure 7A:
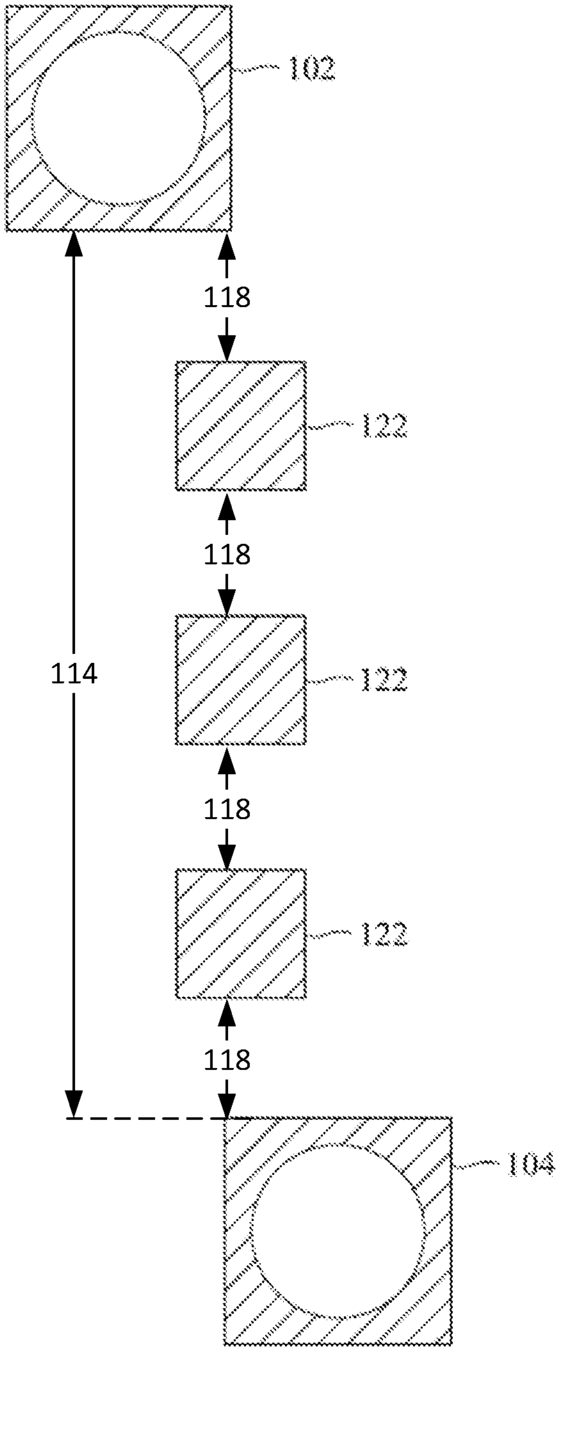
FIGS. 7A, 7B, and 7C are detail views of a conductive pad pair with multiple conductive elements therebetween, in accordance with some embodiments.
Figure 7B:
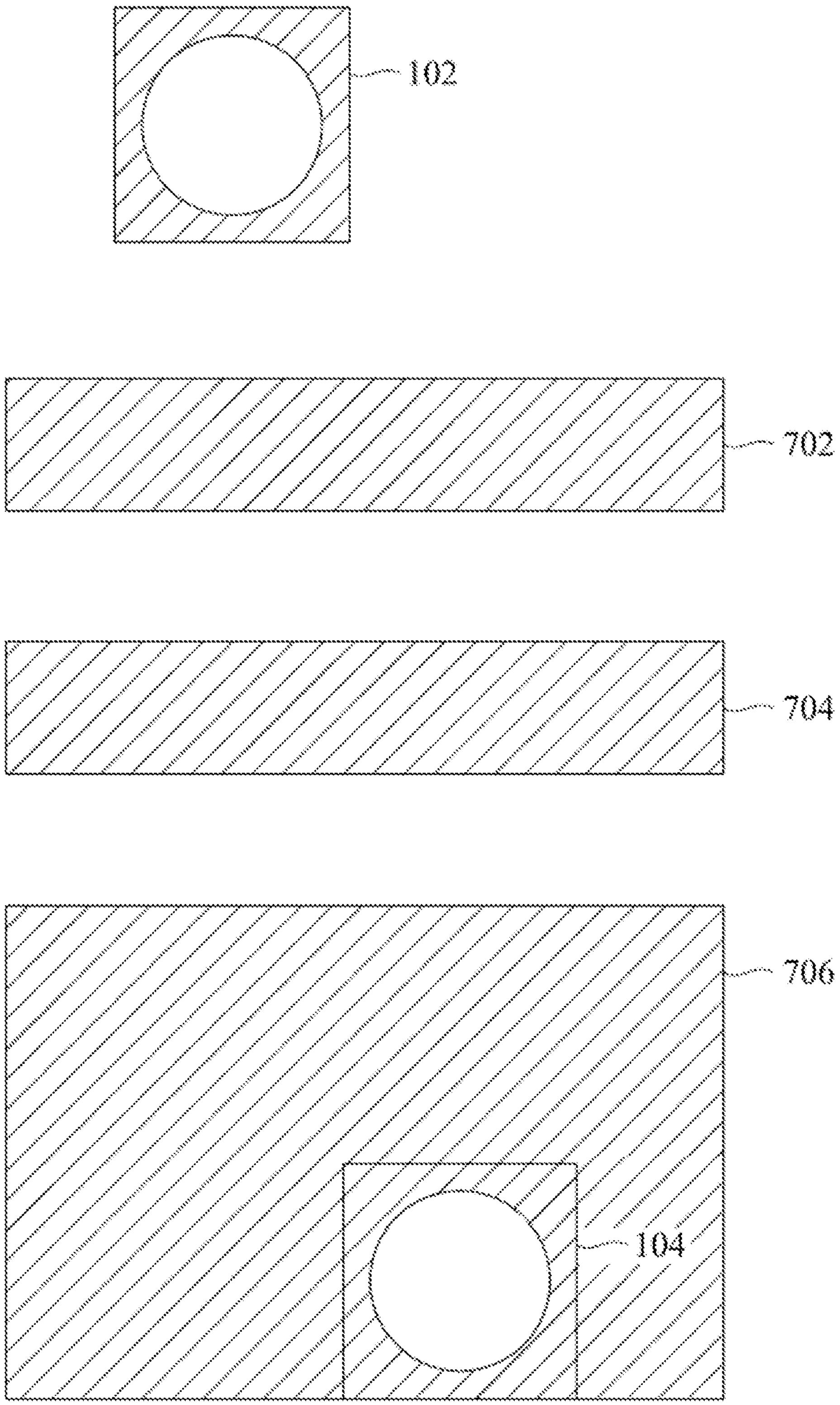
Figure 7C:
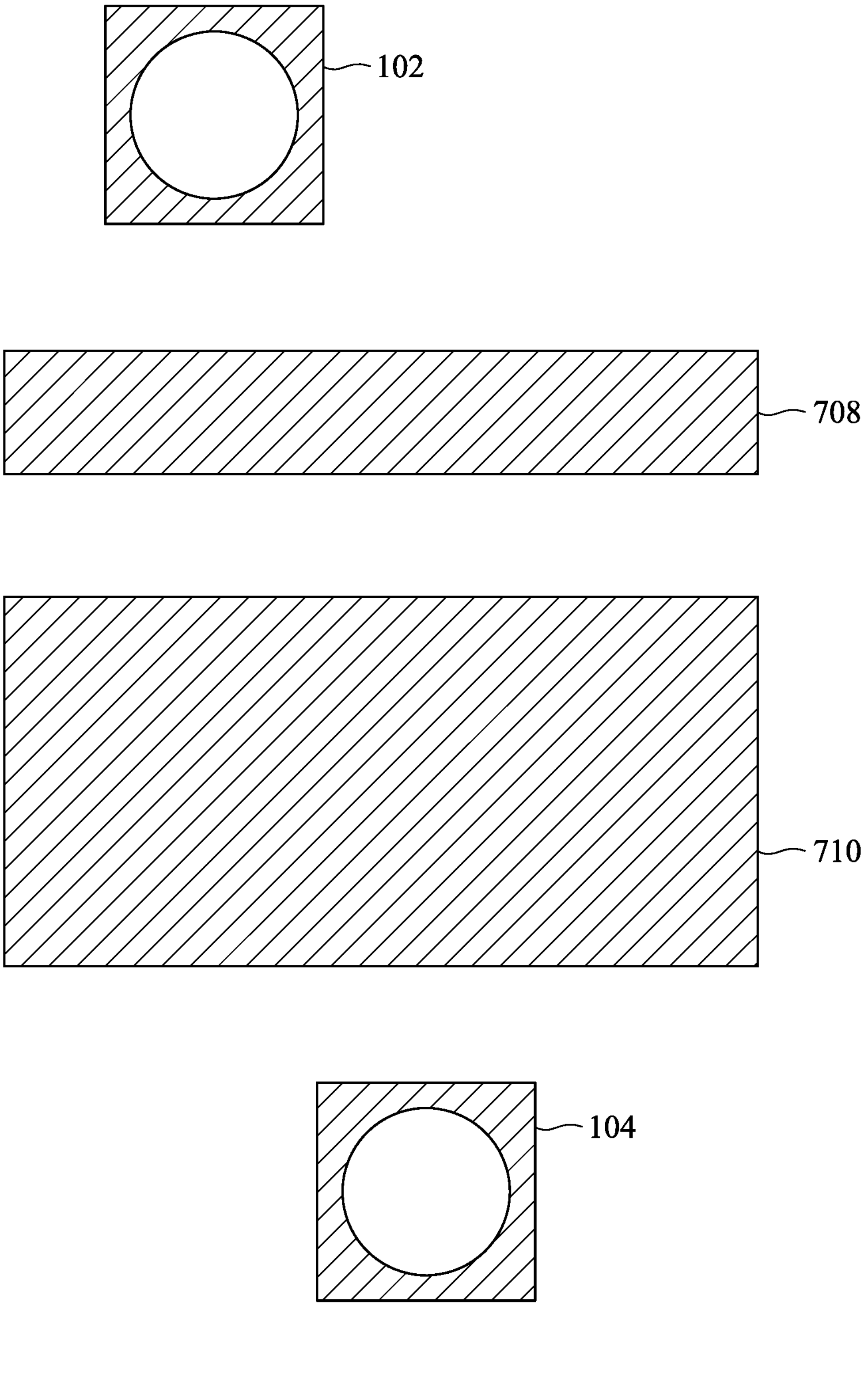

FIGS. 7A, 7B, and 7C are detail views of a conductive pad pair 102, 104 with multiple conductive traces 122 therebetween, in accordance with some embodiments. Referring to FIG. 7A, conductive traces 122 are shown between the first 102 and second conductive pads 104. The conductive traces 122 may be defined by an EDA tool or formed over a surface of a semiconductor device. The conductive traces 122 can extend along a minimum distance 114 between the conductive pads 102, 104. Each of the conductive traces 122 is separated by a spacing 118. Referring now to FIG. 7B, the conductive traces 122 are shown connected to other signals of a netlist for the semiconductor device. For example, a first signal 702 connects a conductive trace 122 to other elements of the semiconductor device. A second signal 704 connects to another conductive trace 122 such as to convey another signal within the semiconductor device. A third signal 706 connects to yet another conductive trace 122. The third signal 706 may, for example, be a power or ground plane. In some embodiments, the third signal 706 can carry a same signal of the second conductive pad 104. For example, the third signal 706 can connect to the second conductive pad 104 and a spacing therebetween can be omitted which can increase a density of conductive traces 122 between the conductive pads 102, 104, or a dimension of the various signals. In some embodiments, the conductive trace 122 can be selected according to an adjacency to the first 102 or second conductive pad 104, wherein the signal can connect to a plane electrically connected to or surrounding the conductive pad 102, 104.

Referring now to FIG. 7C, a first signal 708 is depicted as in FIG. 7B. The second signal 710 is depicted as comprising the thickness of the second signal 704 and the first signal 702 of FIG. 7A, along with a spacing therebetween. In the depicted embodiment, the spacing between the conductive elements is occupied by the conductive trace such that the second signal 710 has a thickness equal to the sum of two of the conductive traces along with the spacing therebetween. According to various embodiments, other thicknesses can be defined such as increasing a thickness of both the first signal 708 and the second signal 710 to occupy a portion of the space vacated by a pruned conductive trace 122.

Figure 8:
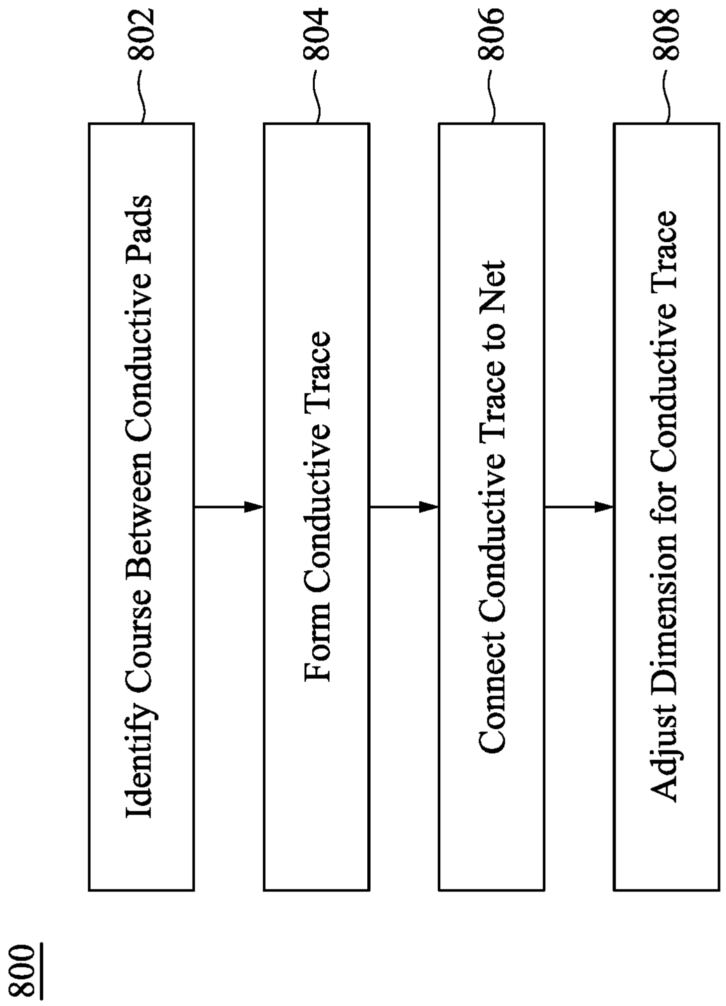
FIG. 8 is a flowchart of a method 800 of forming or manufacturing a semiconductor device, in accordance with some embodiments.

FIG. 8 is a flowchart of a method 800 of forming or manufacturing a semiconductor device, in accordance with some embodiments. It is understood that additional operations may be performed before, during, and/or after the method 800 depicted in FIG. 8. In some embodiments, the method 800 is usable to form a semiconductor device, according to various layout designs as disclosed herein.

At operation 802 of the method 800, a course 124 is identified between at least two conductive pads. For example, the course 124 can be determined by an EDA tool based on dimension therebetween, wherein the conductive pads are a representation of a location for a conductive pad in the EDA tool. The dimension may be a minimum dimension between respective perimeters associated with the at least two conductive pads. The EDA tool can determine the difference by comparing a distance between the perimeters of conductive pads and determining a local minimum therebetween.

The EDA tool can preprocess a plurality of conductive pads to reduce compute power such as by comparing the center point of the conductive pads to a threshold, or by evaluating overlapping portions of the layout individually, which may reduce memory usage, power use, or otherwise improve a performance of an EDA tool relative to comparing every perimeter of every conductive pad or other feature. Although various embodiments described herein refer to conductive pads, the EDA tool can determine similar courses between various semiconductor features such that conductive traces for signals can be formed therebetween.

At operation 804 of the method 800, a first conductive trace is formed. The formation of the conductive trace may be performed by the EDA tool, as a representation of a layer (e.g., a redistribution layer) of a semiconductor device, or formed as a part of manufacturing the semiconductor device based on a design layout received from the EDA tool. The conductive traces can cross the course identified at operation 802. For example, the conductive traces can cross the course at a perpendicular angle. According to some embodiments, the conductive traces may be of a predefined dimension such as a predefined thickness or extend a predefined length. For example, a plurality of conductive traces having a predefined thickness can be disposed perpendicular to the identified course, and can thereafter be merged, pruned, or otherwise adjusted (e.g., by the EDA tool prior to physically forming a metal layer over a semiconductor device). The conductive traces can be formed having a length corresponding to a parallel distance between the conductive pads. The parallel distance can be a same distance between the conductive pads, or an amount less than a threshold, such that minor deviations in a distance between the conductive pads may be disregarded.

At operation 806 of the method 800, the first conductive trace is connected to a net of a netlist. For example, the EDA tool can route various connections of the semiconductor device between dies, terminals, or other components. For example, a routing engine of the EDA tool can associate a logical net of a netlist with a physical location corresponding to the conductive trace. The EDA tool can thereafter route the connecting signals. Any routes passing between the conductive pads can be connected to a conductive trace defined at operation 804. The EDA tool can connect zero, one, or multiple signals to the predefined conductive traces. The definition of the conductive traces may increase a number of routes that can be received between the conductive traces, relative to systems and methods which route the signals directly between the route. For example, the EDA can connect a first signal between the conductive pads which is not perpendicular to a course between the conductive pads, and can thus block further signals from routing between the pads. Moreover, by defining the perpendicular direction of the conductive traces, the EDA tool can route a conductive trace between conductive pads which may not otherwise fit within design rules (e.g., at different angles).

At operation 808 of the method 800, a dimension for a conductive trace is adjusted. The EDA tool may route fewer signals between a pair of conductive pads than a number of available conductive traces. For example, the EDA tool can define 5 conductive traces and route two signals between the conductive pads, each to one of the conductive traces. The remaining 3 conductive traces can be pruned which can increase a spacing between the remaining conductive traces and the conductive pads. The EDA tool can increase a thickness of the conductive trace, such as by filling in spacing between existing conductive traces to combine the traces into a same signal (e.g., to decrease a resistivity of a route), or adjust an angle of a conductive trace to decrease a bend rate associated with a routed signal (e.g., to improve signal integrity for high speed signal lines).

Figure 9:
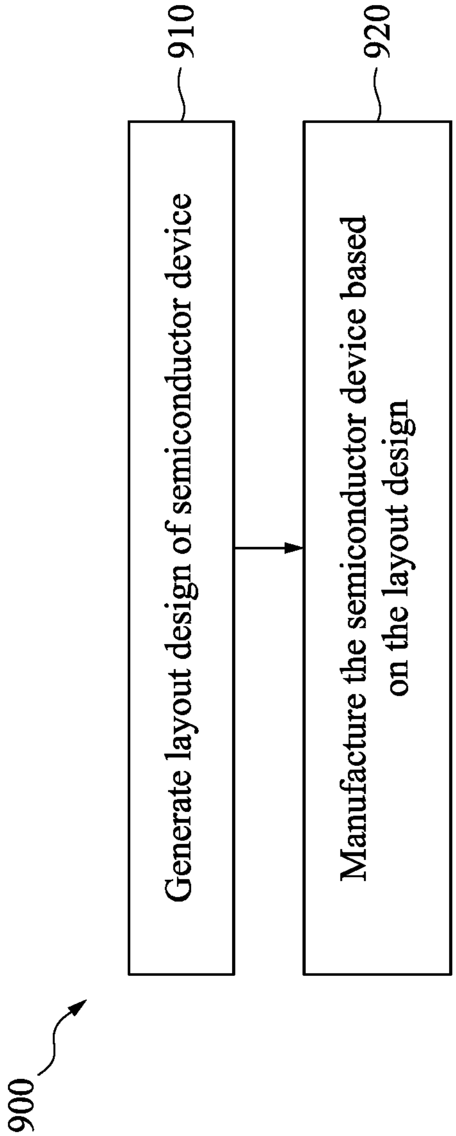
FIG. 9 illustrates a flowchart of a method of manufacturing a semiconductor device, in accordance with some embodiments.

FIG. 9 is a flowchart of a method 900 of forming or manufacturing a semiconductor device, in accordance with some embodiments. It is understood that additional operations may be performed before, during, and/or after the method 900 depicted in FIG. 9. In some embodiments, the method 900 is usable to form a semiconductor device, according to various layout designs as disclosed herein.

In operation 910 of the method 900, a layout design of a semiconductor device (e.g., the layouts of an RDL discussed with respect to FIG. 1) is generated. The operation 910 is performed by a processing device (e.g., processor 1002 of FIG. 10) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format. The operation can be performed to include the use of an EDA tool.

In operation 920 of the method 900, a semiconductor device (e.g., at least a portion of each of the packages) is manufactured based on the layout design. In some embodiments, the operation 920 of the method 900 includes manufacturing at least one mask based on the layout design, and manufacturing the semiconductor device based on the at least one mask.

Figure 10:
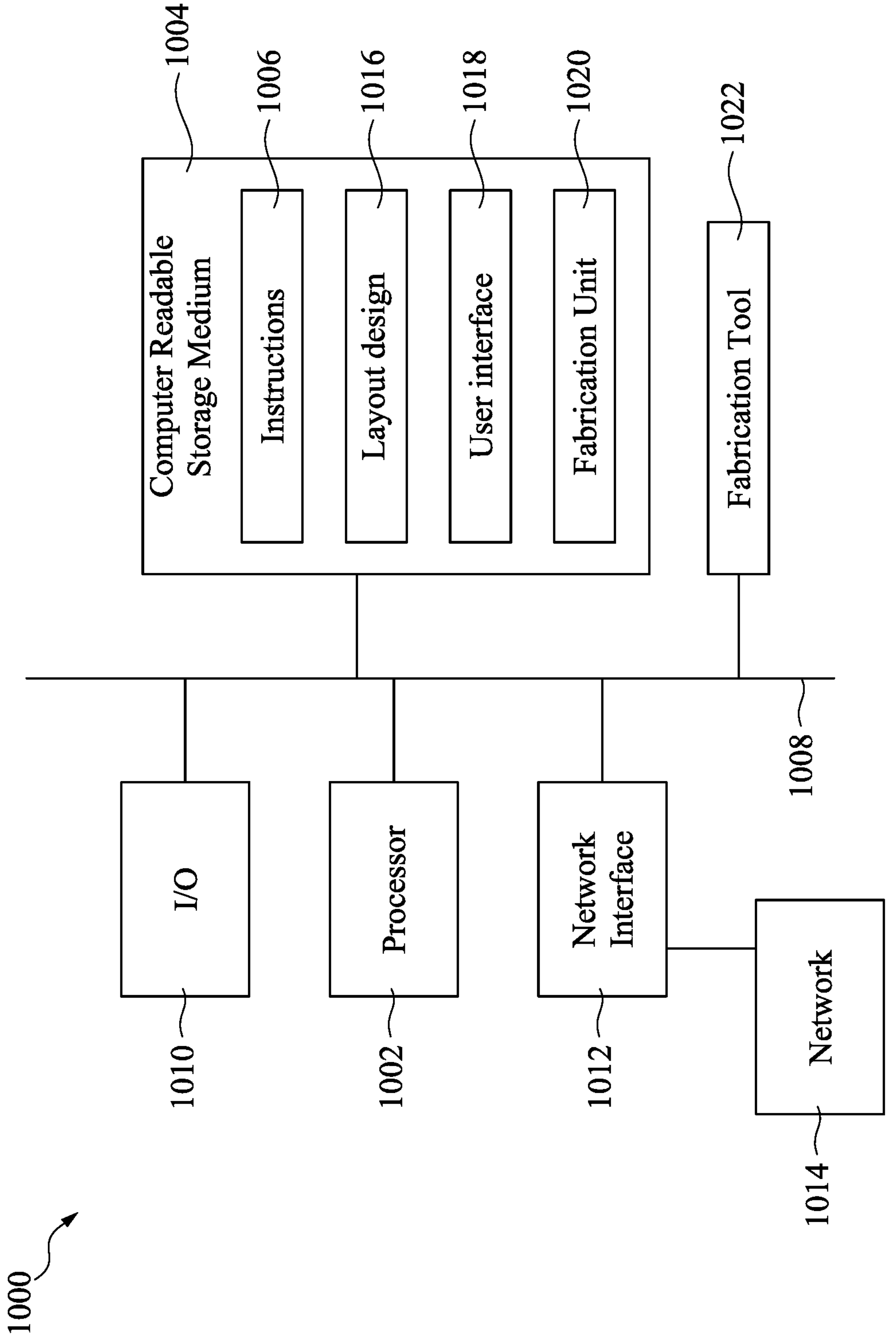
FIG. 10 illustrates a block diagram of a system of generating an layout design, in accordance with some embodiments.

FIG. 10 is a schematic view of a system 1000 for designing and manufacturing an IC layout design, in accordance with some embodiments. The system 1000 generates or places one or more IC layout designs, as described herein. In some embodiments, the system 1000 manufactures one or more semiconductor devices based on the one or more IC layout designs, as described herein. The system 1000 includes a hardware processor 1002 and a non-transitory, computer readable storage medium 1004 encoded with, e.g., storing, the computer program code 1006, e.g., a set of executable instructions. The computer readable storage medium 1004 is configured for interfacing with manufacturing machines for producing the semiconductor device. The processor 1002 is electrically coupled to the computer readable storage medium 1004 by a bus 1008. The processor 1002 is also electrically coupled to an I/O interface 1010 by the bus 1008. A network interface 1012 is also electrically connected to the processor 1002 by the bus 1008. Network interface 1012 is connected to a network 1014, so that the processor 1002 and the computer readable storage medium 1004 are capable of connecting to external elements via network 1014. The processor 1002 is configured to execute the computer program code 1006 encoded in the computer readable storage medium 1004 in order to cause the system 1000 to be usable for performing a portion or all of the operations as described in method 900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause the system 1000 to perform the method 900. In some embodiments, the storage medium 1004 also stores information needed for performing method 900 as well as information generated during performance of method 900, such as layout design 1016, user interface 1018, fabrication unit 1020, and/or a set of executable instructions to perform the operation of method 900.

In some embodiments, the storage medium 1004 stores instructions (e.g., the computer program code 1006) for interfacing with manufacturing machines. The instructions (e.g., the computer program code 1006) enable the processor 1002 to generate manufacturing instructions readable by the manufacturing machines to effectively implement the method 900 during a manufacturing process.

The system 1000 includes the I/O interface 1010. The I/O interface 1010 is coupled to external circuitry. In some embodiments, the I/O interface 1010 includes a keyboard, keypad, mouse, trackball, trackpad, and/or cursor direction keys for communicating information and commands to the processor 1002.

The system 1000 also includes the network interface 1012 coupled to the processor 1002. The network interface 1012 allows the system 1000 to communicate with the network 1014, to which one or more other computer systems are connected. The network interface 1012 includes wireless network interfaces such as BLUETOOTH, WIFI, WIMAX, GPRS, or WCDMA; or wired network interface such as ETHERNET, USB, or IEEE-13154. In some embodiments, the method 900 is implemented in two or more systems 1000, and information such as layout design, user interface and fabrication unit are exchanged between different systems 1000 by the network 1014.

The system 1000 is configured to receive information related to a layout design through the I/O interface 1010 or network interface 1012. The information is transferred to the processor 1002 by the bus 1008 to determine a layout design for producing an IC. The layout design is then stored in the computer readable medium 1004 as the layout design 1016. The system 1000 is configured to receive information related to a user interface through the I/O interface 1010 or network interface 1012. The information is stored in the computer readable medium 1004 as the user interface 1018. The system 1000 is configured to receive information related to a fabrication unit through the I/O interface 1010 or network interface 1012. The information is stored in the computer readable medium 1004 as the fabrication unit 1020. In some embodiments, the fabrication unit 1020 includes fabrication information utilized by the system 1000.

In some embodiments, the method 900 is implemented as a standalone software application for execution by a processor. In some embodiments, the method 900 is implemented as a software application that is a part of an additional software application. In some embodiments, the method 900 is implemented as a plug-in to a software application. In some embodiments, the method 900 is implemented as a software application that is a portion of an EDA tool. In some embodiments, the method 900 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the method 900 is implemented by a manufacturing device to manufacture an integrated circuit using a set of masks manufactured based on one or more layout designs generated by the system 1000. In some embodiments, the system 1000 includes a manufacturing device (e.g., fabrication tool 1022) to manufacture an integrated circuit using a set of masks manufactured based on one or more layout designs of the present disclosure. In some embodiments, the system 1000 of FIG. 10 generates layout designs of an IC that are smaller than other approaches. In some embodiments, the system 1000 of FIG. 10 generates layout designs of a semiconductor device that occupy less area than other approaches.

Figure 11:
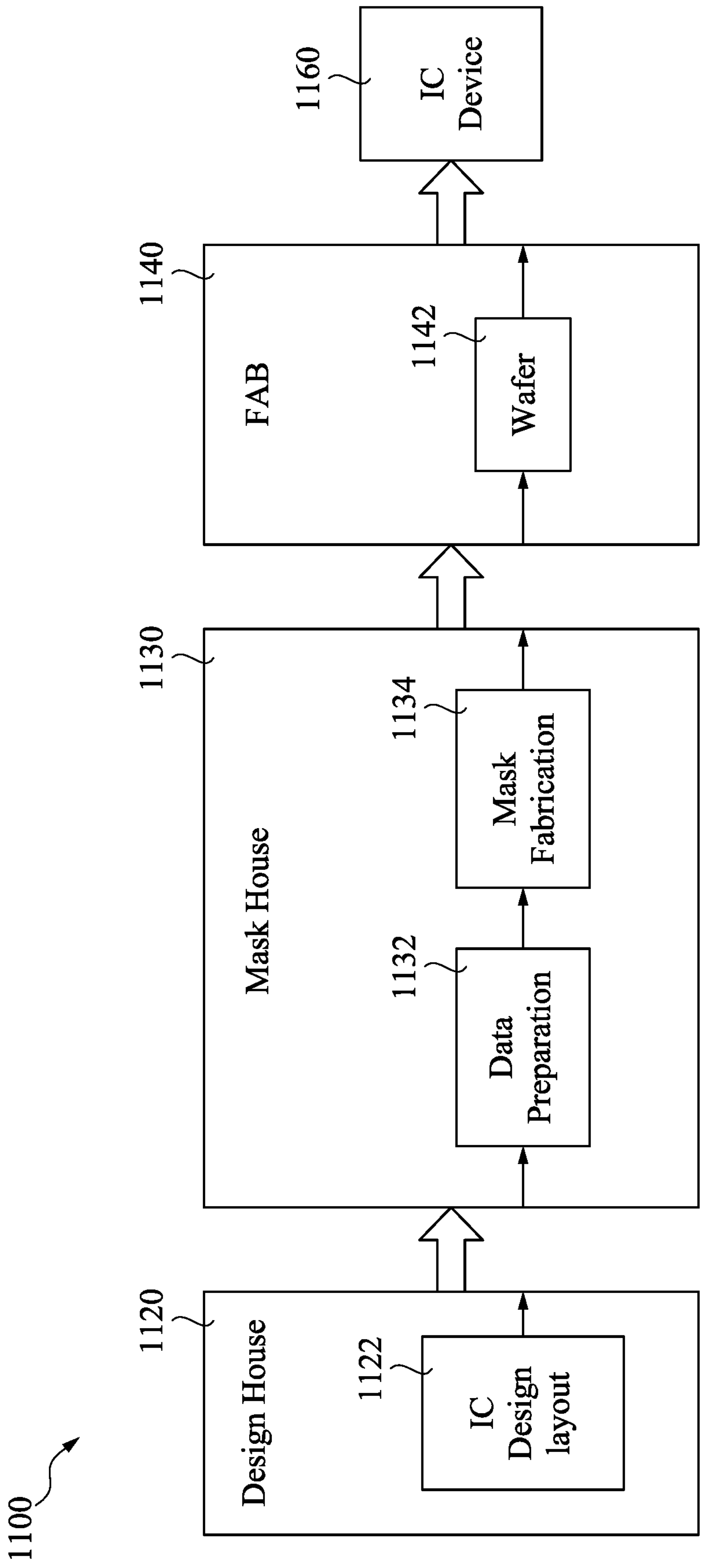
FIG. 11 illustrates a block diagram of a manufacturing system, and a manufacturing flow associated therewith, in accordance with some embodiments.

FIG. 11 is a block diagram of an integrated circuit (IC)/semiconductor device manufacturing system 1100, and an IC manufacturing flow associated therewith, in accordance with at least one embodiment of the present disclosure.

In FIG. 11, the IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device (semiconductor device) 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1140 is owned by a single company. In some embodiments, two or more of design house 1120, mask house 1130, and IC fab 1140 coexist in a common facility and use common resources.

The design house (or design team) 1120 generates an IC design layout 1122. The IC design layout 1122 includes various geometrical patterns designed for the IC device 1160. The geometrical patterns correspond to patterns of metal, oxide, or semiconductor layers that make up the various components of the IC device 1160 to be fabricated. The various layers combine to form various IC features. For example, a portion of the IC design layout 1122 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 1120 implements a proper design procedure to form the IC design layout 1122. The design procedure includes one or more of logic design, physical design or place and route. The IC design layout 1122 is presented in one or more data files having information of the geometrical patterns. For example, the IC design layout 1122 can be expressed in a GDSII file format or DFII file format.

The mask house 1130 includes mask data preparation 1132 and mask fabrication 1134. The mask house 1130 uses the IC design layout 1122 to manufacture one or more masks to be used for fabricating the various layers of the IC device 1160 according to the IC design layout 1122. The mask house 1130 performs the mask data preparation 1132, where the IC design layout 1122 is translated into a representative data file ("RDF"). The mask data preparation 1132 provides the RDF to the mask fabrication 1134. The mask fabrication 1134 includes a mask writer. A mask writer converts the RDF to an image on a substrate, such as a mask (reticle) or a semiconductor wafer, or a metal layer which is formed and thereafter selectively etched to form a redistribution layer at a back end of line process of the fab. The design layout is manipulated by the mask data preparation 1132 to comply with particular characteristics of the mask writer and/or requirements of the IC fab 1140. In FIG. 11, the mask data preparation 1132 and mask fabrication 1134 are illustrated as separate elements. In some embodiments, the mask data preparation 1132 and mask fabrication 1134 can be collectively referred to as mask data preparation.

In some embodiments, the mask data preparation 1132 includes optical proximity correction (OPC) which uses lithography enhancement techniques to compensate for image errors, such as those that can arise from diffraction, interference, other process effects and the like. OPC adjusts the IC design layout 1122. In some embodiments, the mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 1134, which may undo part of the modifications performed by OPC in order to meet mask creation rules.

In some embodiments, the mask data preparation 1132 includes lithography process checking (LPC) that simulates processing that will be implemented by the IC fab 1140 to fabricate the IC device 1160. LPC simulates this processing based on the IC design layout 1122 to create a simulated manufactured device, such as the IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 1122.

It should be understood that the above description of the mask data preparation 1132 has been simplified for the purposes of clarity. In some embodiments, the mask data preparation 1132 includes additional features such as a logic operation (LOP) to modify the IC design layout according to manufacturing rules. Additionally, the processes applied to the IC design layout 1122 during the mask data preparation 1132 may be executed in a variety of different orders.

After the mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 1140 is an IC fabrication entity that includes one or more manufacturing facilities for the fabrication of a variety of different IC products. In some embodiments, the IC fab 1140 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs) and a third manufacturing facility may provide the back end fabrication for the interconnection and packaging of the IC products (e.g., M0 tracks, M1 tracks, BM0 tracks, BM1 tracks), and a fourth manufacturing facility may provide other services for the foundry entity.

The IC fab 1140 uses the mask (or masks) fabricated by the mask house 1130 to fabricate the IC device 1160. Thus, the IC fab 1140 at least indirectly uses the IC design layout 1122 to fabricate the IC device 1160. In some embodiments, a semiconductor wafer is fabricated by the IC fab 1140 using the mask (or masks) to form the IC device 1160. The semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

The system 1100 is shown as having the design house 1120, mask house 1130, and IC fab 1140 as separate components or entities. However, it should be understood that one or more of the design house 1120, mask house 1130 or IC fab 1140 are part of the same component or entity.

In one aspect of the present disclosure, a method is disclosed. The method includes identifying a course extending from a first one of a plurality of conductive pads to a second one of the plurality of conductive pads. The course represents a minimum distance between a first perimeter of the first conductive pad and a second perimeter of the second conductive pad. The method includes forming a first conductive trace crossing the identified course. The first conductive trace can extend along a direction perpendicular to the course.

In another aspect of the present disclosure, a semiconductor device is disclosed. The semiconductor device includes a redistribution layer configured to redistribute connectors of a semiconductor die, wherein the redistribution layer including a plurality of conductive pads embedded in a dielectric material. The redistribution layer includes a first conductive pad comprising a first perimeter dimension. The redistribution layer includes a second conductive pad comprising a second perimeter dimension. The redistribution layer includes at least one conductive trace which is perpendicular to a minimum distance between the first perimeter dimension and the second perimeter dimension.

In yet another aspect of the present disclosure, a non-transitory computer-readable media is disclosed. The non-transitory computer-readable media includes instructions to define a first conductive pad bounded by a first perimeter along a lateral plane of a semiconductor device. The non-transitory computer-readable media includes instructions to define a second conductive pad bounded by a second perimeter along the lateral plane. The non-transitory computer-readable media includes instructions to determine a course between the first perimeter and the second perimeter at a minimum dimension therebetween. The non-transitory computer-readable media includes instructions to define, based on the minimum dimension, a conductive trace between the first conductive pad and the second conductive pad, the conductive trace extending perpendicular to the course along the lateral plane. The non-transitory computer-readable media includes instructions to define a first connection with the conductive trace at a first terminal end of the conductive trace, the first connection corresponding to a net of a netlist. The non-transitory computer-readable media includes instructions to define a second connection with the conductive trace at a second terminal end of the conductive trace, opposite the first terminal end.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

identifying a course extending from a first one of a plurality of conductive pads to a second one of the plurality of conductive pads, wherein the course represents a minimum distance between a first perimeter of the first conductive pad and a second perimeter of the second conductive pad; and forming a first conductive trace crossing the identified course;

wherein the first conductive trace extends along a direction perpendicular to the course.

2. The method of claim 1, wherein the first conductive pad and the second conductive pad are in a same metallization layer.

3. The method of claim 1, wherein the first conductive pad and the second conductive pad are configured to receive a first inter-layer via and a second inter-layer via respectively.

4. The method of claim 1, wherein the first conductive trace extends for a predefined distance.

5. The method of claim 2, further comprising:

connecting the first conductive trace to a plane laterally surrounding at least one of the first conductive pad or the second conductive pad.

6. The method of claim 1, further comprising:

forming a second conductive trace extending along the direction perpendicular to the direction of the course, parallel to the first conductive trace.

7. The method of claim 6, wherein:

the first conductive trace has a first thickness; and the second conductive trace has a second thickness which is a sum of double the first thickness and a distance between the first conductive trace and the second conductive trace.

8. The method of claim 1, wherein a length of the first conductive trace is based on a distance from the first conductive pad and the second conductive pad.

9. The method of claim 6, wherein a length of the first conductive trace extends beyond a parallel distance separating the first conductive pad and the second conductive pad along opposite ends of the course.

10. The method of claim 1, further comprising:

defining connections corresponding to a net of a netlist, the net being associated with a signal type; and adjusting a thickness of the first conductive trace to correspond to the signal type.

11. The method of claim 6, further comprising:

pruning the second conductive trace after connecting the first conductive trace to a net of a netlist.

12. A non-transitory computer-readable media comprising computer-readable instructions stored thereon, that when executed by a processor cause the processor to:

define a first conductive pad bounded by a first perimeter along a lateral plane of a semiconductor device;

define a second conductive pad bounded by a second perimeter along the lateral plane;

determine a course between the first perimeter and the second perimeter at a minimum dimension therebetween;

define, based on the minimum dimension, a conductive trace between the first conductive pad and the second conductive pad, the conductive trace extending perpendicular to the course along the lateral plane;

define a first connection with the conductive trace at a first terminal end of the conductive trace, the first connection corresponding to a net of a netlist; and define a second connection with the conductive trace at a second terminal end of the conductive trace, opposite the first terminal end.

13. The non-transitory computer-readable media of claim 12, further comprising instructions to define an integer number of additional conductive traces perpendicular to the conductive trace, based on a distance of the minimum dimension.

14. The non-transitory computer-readable media of claim 13, wherein each of the conductive trace and the additional conductive traces are of a same thickness.

15. The non-transitory computer-readable media of claim 13, wherein at least one of the additional conductive traces are of a thickness of a sum of at least two times a thickness of the conductive trace and a spacing between the conductive trace and the at least one of the additional conductive traces.

16. The non-transitory computer-readable media of claim 12, wherein a conductive trace proximal to the first conductive pad is connected to a plane enveloping the first conductive pad along the lateral plane.

17. The non-transitory computer-readable media of claim 12, further comprising:

determining a signal type of the net of the netlist; and defining a thickness of the conductive trace based on the signal type.

18. A method, comprising:

identifying a course extending from a first conductive pad to a second conductive pad, the identified course representing a minimum distance between a first perimeter of the first conductive pad and a second perimeter of the second conductive pad;

forming a first conductive trace crossing the identified course, the first conductive trace extending along a direction perpendicular to the course;

defining a first connection with the first conductive trace at a first terminal end of the first conductive trace, the first connection corresponding to a net of a netlist; and defining a second connection with the first conductive trace at a second terminal end of the first conductive trace, opposite the first terminal end.

19. The method of claim 18, further comprising:

forming a second conductive trace extending along the direction perpendicular to the identified course, the second conductive trace being parallel to the first conductive trace.

20. The method of claim 18, further comprising:

identifying a second course extending from the second conductive pad to a third conductive pad, the second identified course representing a second minimum distance between the second perimeter of the second conductive pad and a third perimeter of the third conductive pad; and forming a second conductive trace crossing the second identified course, the second conductive trace extending along a direction perpendicular to the second identified course.

* * * * *